(12) United States Patent
Agata et al.

(10) Patent No.: US 6,243,301 B1
(45) Date of Patent: Jun. 5, 2001

(54) SEMICONDUCTOR MEMORY DEVICE AND SIGNAL LINE SWITCHING CIRCUIT

(75) Inventors: Masashi Agata, Osaka; Naoki Kuroda, Kyoto; Makoto Kojima, Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/447,674

(22) Filed: Nov. 23, 1999

(30) Foreign Application Priority Data

Nov. 27, 1998 (JP) .................................................. 10-336620
May 21, 1999 (JP) .................................................. 11-141713

(51) Int. Cl.$^7$ .................................................. G11C 7/00
(52) U.S. Cl. ........................... 365/189.02; 365/189.01; 365/230.03; 365/230.06; 365/230.02
(58) Field of Search ........................ 365/189.01, 189.02, 365/230.01, 230.02, 230.06

(56) References Cited

U.S. PATENT DOCUMENTS

| | | | | |
|---|---|---|---|---|
| 5,548,553 | * | 8/1996 | Cooper et al. ........................ | 365/200 |
| 5,701,270 | * | 12/1997 | Mohan Rao ....................... | 365/230.03 |
| 5,808,946 | | 9/1998 | Roohparvar ........................... | 365/200 |
| 5,831,924 | * | 11/1998 | Nitta et al. ........................ | 365/230.03 |
| 5,958,068 | * | 9/1999 | Arimilli et al. .......................... | 714/8 |
| 6,021,512 | * | 2/2000 | Lattimore et al. ..................... | 714/710 |
| 6,040,999 | * | 3/2000 | Hotta et al. ............................ | 365/200 |
| 6,058,065 | * | 5/2000 | Lattimore et al. ............... | 365/230.03 |
| 6,072,735 | * | 6/2000 | Komoriya et al. ............... | 365/230.06 |

FOREIGN PATENT DOCUMENTS 05334898  12/1993  (JP) .
06139797  5/1994  (JP) .

* cited by examiner

*Primary Examiner*—Viet Q. Nguyen
(74) *Attorney, Agent, or Firm*—McDermott, Will & Emery

(57) ABSTRACT

Redundancy function with excellent repair efficiency is implemented by specifying a single address for a semiconductor memory device of a multi-bit accessing type. A memory array includes a plurality of memory segments associated with respective addresses. Each memory segment is coupled to a data bus multiplexer via an associated first data bus. A sub-data bus, which includes a larger number of signal lines than that of those included in the first data bus, is provided for each memory segment. These signal lines are connected to associated bit lines in each memory sub-array. A data bus switching circuit is associated with each memory segment to electrically connect the respective signal lines included in the first data bus to the counterparts included in the sub-data bus to meet a predetermined relationship by cutting one of fuses off. In this manner, redundancy function with excellent repair efficiency is implementable on a bit-by-bit basis, not on an address basis.

21 Claims, 10 Drawing Sheets

SEMICONDUCTOR MEMORY DEVICE AND SIGNAL LINE SWITCHING CIRCUIT

BACKGROUND OF THE INVENTION

The present invention relates to a semiconductor memory device with a so-called "redundancy function", i.e., preparing a redundant component to repair another equivalent one not functioning correctly due to a defect brought about during the manufacturing process of the device.

FIG. 10 illustrates a configuration of a conventional semiconductor memory device with a redundancy function (see Japanese Laid-Open Publication No. 6-139797). In FIG. 10, a memory array 101 includes a plurality of memory cells, each storing data thereon, and a redundant memory array 102 includes a plurality of redundant memory cells to repair defective components possibly included in the memory array 101.

The semiconductor memory device shown in FIG. 10 operates in the following manner. When the device is externally accessed, an address input circuit 103 outputs an address signal associated with an address specified. A decoder 104 decodes the address signal and outputs the decoded signal to a data bus switching circuit 109. At the same time, a redundant driver 105 also generates a signal and provides the signal to the data bus switching circuit 109. Responsive to the decoded signal, the data bus switching circuit 109 electricaly connects a data line IO to a particular memory cell associated with the specified address in the memory array 101. Also, responsive to the output signal of the redundant driver 105, the switching circuit 109 electrically connects a redundant data line RIO to the redundant memory array 102.

The addresses of defective memory cells are stored in advance in a redundancy decision circuit 106. Responsive to the address signal, the redundancy decision circuit 106 compares the address specified to those of the defective memory cells. If one of those addresses matches up to the address specified, then the redundancy decision circuit 106 gets the data read out by a data readout amplifier 108 from the redundant memory array 102 and then output by a data output circuit 110. Alternatively, if none of the addresses match up to the address specified, then the redundancy decision circuit 106 gets the data read out by another data readout amplifier 107 from the memory array 101 and then output by the data output circuit 110.

In this manner, an externally input address is compared to the pre-stored addresses of defective memory cells, and if the input address matches up to one of those addresses, an equivalent memory cell included in the redundant memory array is accessed to repair the defective memory cell. As a result, the yield of the semiconductor memory device is improved.

In recent years, to improve the data transfer capability of a semiconductor memory device, multi-bit accessing, which makes a multiplicity of memory cells accessible with just one address specified, has been implemented.

If a semiconductor memory device with the conventional redundancy function as shown in FIG. 10 is accessed by multi-bit accessing, however, the efficiency of repair is poor. For example, suppose just one defective memory cell is included in 128 memory cells corresponding to a single address specified for a 128-bit semiconductor memory device. In such a case, if the address is pre-stored in the redundancy decision circuit to repair the defective memory cell with a redundant one, then not only the single defective memory cell, but also the other normal 127 memory cells are replaced with respective redundant memory cells. In other words, to repair the single defective memory cell, the 127 normal memory cells are all disabled. Thus, such a repair method is far from being efficient.

SUMMARY OF THE INVENTION

An object of the present invention is providing a redundancy function with excellent repair efficiency for a semiconductor memory device of multi-bit accessing type.

Specifically, a semiconductor memory device according to the present invention is adapted to access a multiplicity of bits at a time responsive to a single address specified. The memory device includes: an array of memory cells, which are subdivided into a plurality of memory segments associated with respective addresses; and an internal data bus, which includes the same number of signal lines as the number of bits and transfers data represented by the multiplicity of bits therethrough. Each said memory segment includes: a memory sub-array; and a sub-data bus including a larger number of signal lines than that of the signal lines included in the internal data bus. The signal lines of the sub-data bus are connected to associated bit lines of the memory sub-array for transferring the data in parallel to each other. The array of memory cells includes connection switching means for electrically connecting the signal lines of the internal data bus to associated ones of the signal lines of the sub-data bus to meet a predetermined relationship.

According to the present invention, a plurality of memory segments are provided for respective addresses, and the connection switching means electrically connects the signal lines of the internal data bus to associated signal lines of the sub-data bus, which are connected to respective bit lines in the memory sub-array in each of these memory segments, to meet a predetermined relationship. Thus, data can be transferred through all the signal lines of the sub-data bus but one that is connected to a defective bit line. That is to say, a defective component can be repaired with a redundant component on a bit-by-bit basis, not on an address basis, thus realizing redundancy function with excellent repair efficiency.

In one embodiment of the present invention, the connection switching means preferably disconnects a specific signal line of the sub-data bus from a corresponding signal line of the internal data bus. The specific signal line is associated with a defective bit line or a defective memory cell. The connection switching means shifts connections of signal lines succeeding the specific signal line of the sub-data bus such that the signal line other than the defective signal line of the sub-data bus are connected to the signal lines of the internal data bus.

In this particular embodiment, the connection switching means preferably includes a plurality of first data buses associated with the respective memory segments and a plurality of data bus switching circuits provided for the respective memory segments. Each said data bus switching circuit electrically connects the signal lines of the sub-data bus associated with the memory segment to the signal lines of the first data bus associated with the memory segment to meet the predetermined relationship. The connection switching means further includes a multiplexer for selecting one of the first data buses that is associated with the memory segment specified and connecting the first data bus selected to the internal data bus.

In this particular embodiment, the sub-data buses are preferably placed in parallel to the first data buses. Also, each said memory segment preferably includes a plurality of the memory sub-arrays, and the bit lines of the respective memory sub-arrays in each said memory segment are preferably connected in common to the associated signal lines of the subdata bus in the memory segment.

In an alternate embodiment, each said data bus switching circuit preferably includes: a switch section for electrically connecting each associated pair of signal lines of the first data bus and the sub-data bus to each other; and a switch control section including a plurality of fuses connected in series to each other and controlling the switch section based on terminal potentials of the fuses. In the switch control section, a first-stage one of the fuses is preferably driven by an associated MOS transistor based on a predetermined potential, while each of the other fuses from the second stage on is preferably driven by an associated MOS transistor based on the terminal potential of a previous-stage one of the fuses.

In this particular embodiment, at least one inverter including an MOS transistor is preferably provided between adjacent ones of the fuses in the switch control section.

In another alternate embodiment, each said data bus switching circuit preferably includes: a switch section for electrically connecting each associated pair of signal lines of the first data bus and the sub-data bus to each other; and a switch control section for controlling the switch section. The switch control section preferably includes: a plurality of control inverters connected in series to each other, a fuse being inserted into a current path between one power supply and the output terminal of each said control inverter; and means for applying a predetermined drive potential to the input of a first-stage one of the control inverters so as to turn ON an associated MOS transistor on the current path to which the corresponding fuse is inserted. Each of the remaining control inverters from the second stage on is preferably driven with the output of a previous-stage one of the control inverters so as to turn ON the associated MOS transistor on the current path to which the fuse is inserted when the drive potential is applied to the input of the first-stage control inverter with none of the fuses of the control inverters cut off. The switch section is preferably controlled based on the outputs of the respective control inverters.

Another semiconductor memory device according to the present invention is also adapted to access a multiplicity of bits at a time responsive to a single address specified. The memory device includes: an array of memory cells, which are subdivided into a plurality of memory segments associated with respective addresses; and a plurality of first data buses associated with the respective memory segments. Each of the first data buses includes the same number of signal lines as the number of bits and transfers data represented by the multiplicity of bits therethrough. Each said memory segment includes: a memory sub-array; and a data bus switching circuit for electrically connecting the signal lines of one of the first data buses that corresponds to the memory segment to associated bit lines of the memory sub-array to meet a predetermined relationship.

According to the present invention, a plurality of memory segments are provided for respective addresses, and the data bus switching circuit electrically connects the signal lines of one of the first data buses that corresponds to each memory segment to associated bit lines of the memory sub-array in the memory segment to meet a predetermined relationship. Thus, data can be transferred through all the bit lines but a defective one. That is to say, a defective component can be repaired with a redundant component on a bit-by-bit basis, not on an address basis, thus realizing redundancy function with excellent repair efficiency.

In one embodiment of the present invention, the data bus switching circuit preferably disconnects a specific bit line from a corresponding signal line of the first data bus. The specific bit line is defective or associated with a defective memory cell. The data bus switching circuit shifts connections of bit lines succeeding the specific bit line such that it lines other than the specific bit line are connected to the signal lines of the first data bus.

In this particular embodiment, the bit lines of the memory sub-array associated with each said memory segment are preferably placed in parallel to the first data bus associated with the memory segment. In an alternate embodiment, each said memory segment preferably includes a plurality of the memory sub-arrays, and the data bus switching circuit is preferably provided for each said memory sub-array.

In another alternate embodiment, each said data bus switching circuit preferably includes: a switch section for electrically connecting each of the signal lines of the first data bus to associated one of the bit lines; and a switch control section including a plurality of fuses connected in series to each other and controlling the switch section based on terminal potentials of the fuses. In the switch control section, a first-stage one of the fuses is preferably driven by an associated MOS transistor based on a predetermined potential, while each of the other fuses from the second stage on is driven by an associated MOS transistor based on the terminal potential of a previous-stage one of the fuses. In this particular embodiment, at least one inverter including an MOS transistor is preferably provided between adjacent ones of the fuses in the switch control section.

In still another embodiment, each said data bus switching circuit preferably includes: a switch section for electrially connecting each of the signal lines of the first data bus to associated one of the bit lines; and a switch control section for controlling the switch section. The switch control section preferably includes: a plurality of control inverters connected in series to each other, a fuse being inserted into a current path between one power supply and the output terminal of each said control inverter; and means for applying a predetermined drive potential to the input of a first-stage one of the control inverters so as to turn ON an associated MOS transistor on the current path to which the corresponding fuse is inserted. Each of the remaining control inverters from the second stage on is preferably driven with the output of a previous-stage one of the control inverters so as to turn ON the associated MOS transistor on the current path to which the fuse is inserted when the drive potential is applied to the input of the first-stage control inverter with none of the fuses of the control inverters cut off. The switch section is preferably controlled based on the outputs of the respective control inverters.

A signal line switching circuit according to the present invention includes: a switch section for electrically connecting each associated pair of signal lines belonging to first and second groups to each other to meet a predetermined relationship; and a switch control section including a plurality of fuses connected in series to each other and controlling the switch section based on terminal potentials of the fuses. In the switch control section, a first-stage one of the fuses is preferably driven by an associated MOS transistor based on a predetermined potential, while each of the other fuses from the second stage on is preferably driven by an associated MOS transistor based on the terminal potential of a previous-stage one of the fuses.

According to the present invention, fuses are provided for a switch control section and connected in series to each other. Each of these fuses is driven by an associated MOS transistor based on a predetermined potential or a terminal potential of a previous-stage one of the fuses. Thus, even if one of the fuses has not been cut off completely to control the switch section, none of the fuses has its terminal potential equalized with an intermediate potential or a potential different from a desired one. That is to say, even if the fuse has not been cut off completely, the signal line switching circuit can still operate normally. As a result, a highly reliable signal line switching circuit is provided.

In one embodiment of the present invention, at least one inverter including an MOS transistor is preferably provided between adjacent ones of the fuses in the switch control section.

In another embodiment of the present invention, the first group preferably consists of a number n of signal lines and the second group preferably consists of a number (n+1) of signal lines, where n is a positive integer. The switch section preferably includes an $i^{th}$ pair of switches, which are provided between the $i^{th}$ one of the signal lines of the first group and the $i^{th}$ and $(i+1)^{st}$ ones of the signal lines of the second group, where i is an integer and $1 \leq i \leq n$. The switch control section preferably controls the $i^{th}$ pair of switches based on a terminal potential of the $i^{th}$-stage one of the fuses.

In still another embodiment, each said signal line of the first and second groups is preferably composed of a number k of signal lines, where k is an integer equal to or larger than two. The first group preferably consists of a number n of signal line sets and the second group preferably consists of a number (n+1) of signal line sets, where n is a positive integer. The switch section preferably includes an $i^{th}$ group of switches, which are provided between the $i^{th}$ set of the signal lines of the first group and the $i^{th}$ and $(i+1)^{st}$ sets of the signal lines of the second group, where i is an integer and $1 \leq i \leq n$. The $i^{th}$ group consists of a number 2k of switches. The switch control section preferably controls the $i^{th}$ group of switches based on a terminal potential of the $i^{th}$-stage one of the fuses.

Another signal line switching circuit according to the present invention includes: a switch section for electrically connecting each associated pair of signal lines belonging to first and second groups to each other to meet a predetermined relationship; and a switch control section including a plurality of fuses connected in series to each other and controlling the switch section based on terminal potentials of the fuses. The switch control section includes: a latch circuit, associated with each said fuse, for latching a terminal potential of the fuse; and means for initializing the potential latched in the latched circuit. If a predetermined potential is applied to a first-stage one of the fuses and none of the fuses have been cut off, each said latch circuit latches a potential corresponding to a terminal potential of the first-stage fuse. If one of the fuses has been cut off, the latch circuits preceding the cut-off fuse latch the potential corresponding to the terminal potential of the first-stage fuse, while the latch circuits succeeding the cut-off fuse latch the initializing potential as it is.

In one embodiment of the present invention, each said latch circuit may include: a first inverter connected in series to the associated fuse; and a second inverter connected in parallel to the first inverter in an opposite direction. In an alternate embodiment, each said latch circuit may include: an inverter connected in series to the associated fuse; and an n-channel MOS transistor, which receives the output of the inverter at the gate thereof and the drain potential of which is applied as an input to the inverter. In another alternate embodiment, each said latch circuit may include a NOR gate, which receives the terminal potential of the associated fuse as one of the two inputs thereof and a selection signal as the other input thereof. The selection signal indicates whether or not the signal line switching circuit should operate. The latch circuit may further include an n-channel MOS transistor, which receives the output of the NOR gate at the gate thereof and the drain potential of which is applied as one of the two inputs to the NOR gate.

Still another signal line switching circuit according to the present invention includes: a switch section for electrically connecting each associated pair of signal lines belonging to first and second groups to each other to meet a predetermined relationship; and a switch control section for controlling the switch section. The switch control section includes: a plurality of control inverters connected in series to each other, a fuse being inserted into a current path between one power supply and the output terminal of each said control inverter; and means for applying a predetermined drive potential to the input of a first-stage one of the control inverters so as to turn ON an associated MOS transistor on the current path to which the corresponding fuse is inserted. Each of the remaining control inverters from the second stage on is driven with the output of a previous-stage one of the control inverters so as to turn ON the associated MOS transistor on the current path to which the fuse is inserted when the drive potential is applied to the input of the first-stage control inverter with none of the fuses of the control inverters cut off. The switch section is controlled based on the outputs of the respective control inverters.

In one embodiment of the present invention, the first group preferably consists of a number n of signal lines and the second group preferably consists of a number (n+1) of signal lines, where n is a positive integer. The switch section preferably includes an $i^{th}$ pair of switches, which are provided between the $i^{th}$ one of the signal lines of the first group and the $i^{th}$ and $(i+1)^{st}$ ones of the signal lines of the second group, where i is an integer and $1 \leq i \leq n$. The switch control section preferably controls the $i^{th}$ pair of switches based on the output of the $i^{th}$-stage one of the control inverters.

In another embodiment, the potential applying means preferably applies a predetermined initializing potential to the input of the first-stage control inverter so as to turn ON an MOS transistor on a current path between the other power supply, which is more distant from the fuse inserted, and the output terminal of the control inverter. The switch control section preferably includes a plurality of latch circuits associated with the respective control inverters. Each said latch circuit latches, as the initializing potential thereof, the output of the first-stage control inverter to which the initializing potential is applied as an input.

DESCRIPTION OF THE PREFERRED EMBODIMENTS

Hereinafter, preferred embodiments of the present invention will be described with reference to the accompanying drawings.

Figure 1:
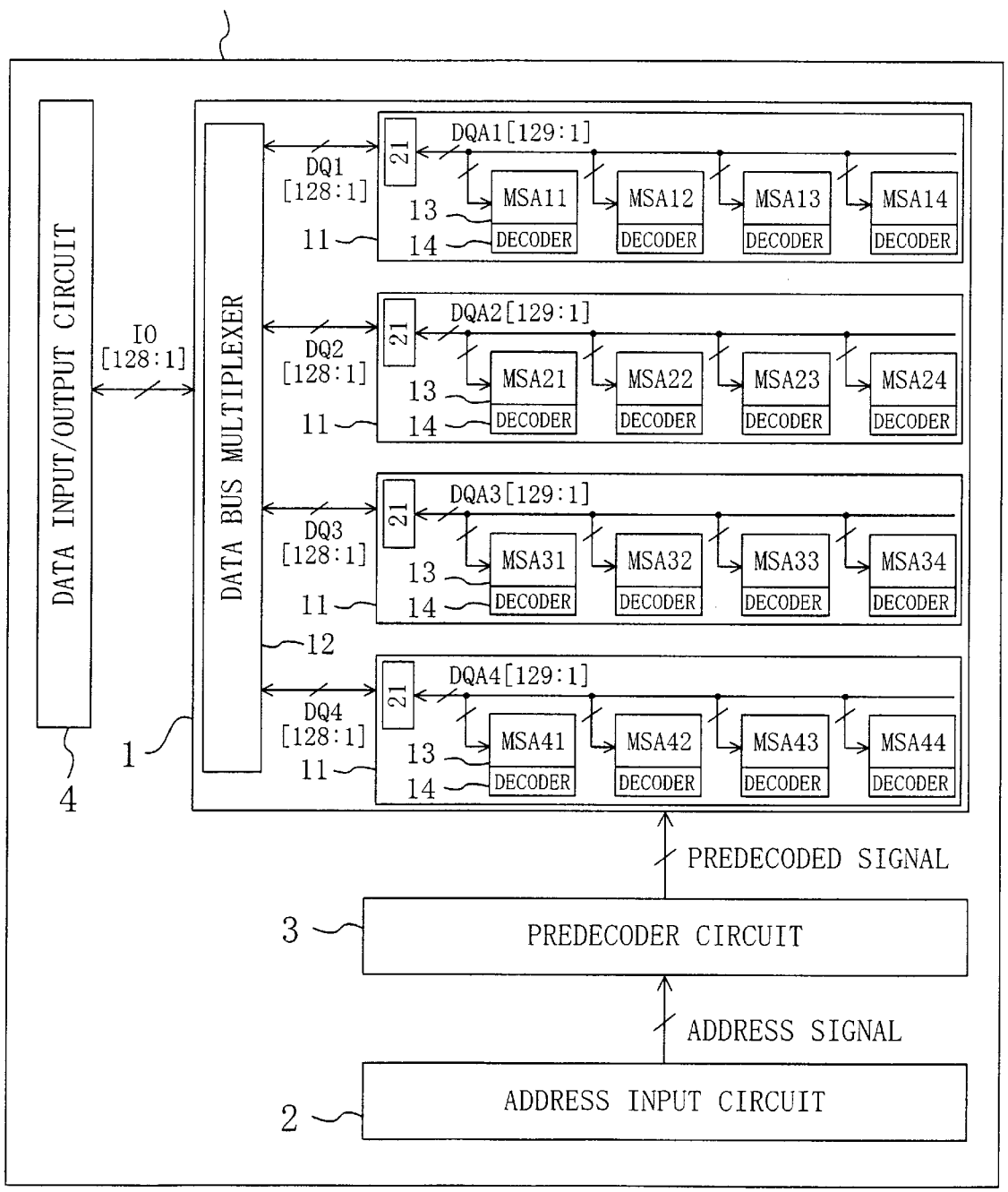
FIG. 1 is a block diagram illustrating a configuration for a semiconductor memory device according to an embodiment of the present invention.

FIG. 1 illustrates a configuration of a semiconductor memory device according to an exemplary embodiment of the present invention. As shown in FIG. 1, the semiconductor memory device includes memory array 1, address input circuit 2, pre-decoder 3 and data input/output circuit 4. The memory array 1 consists of a plurality of memory cells, each storing data thereon. Responsive to an externally input address, the address input circuit 2 provides an associated address signal to the pre-decoder 3. The pre-decoder 3 decodes the address signal in advance, thereby providing the pre-decoded signal to the memory array 1. The data input/output circuit 4 functions as an interface between the memory array 1 and an external component in exchanging data therebetween. In the semiconductor memory device shown in FIG. 1, the bit width of an internal data bus IO is 128 bits as represented by a label [128:1] in FIG. 1, which representation will be applied to the other drawings. That is to say, 128 bits are accessible simultaneously by specifying a single address.

The memory array 1 includes a plurality of (e.g., four in the example illustrated in FIG. 1) memory segments 11, a plurality of data buses DQn (where n=1 to 4) and a data bus multiplexer 12. The memory segments 11 are provided for respective addresses. The data buses DQ1 through DQ4, which are equivalent to the first data buses as defined in the appended claims, are coupled to these memory segments 11, respectively. The data bus multiplexer 12 selectively connects one of the data buses DQn, which is associated with a memory segment 11 specified by the pre-decoded signal, to the internal data bus IO.

Each of these memory segments 11 includes a plurality of (e.g., four in the example illustrated in FIG. 1) memory sub-arrays 13 (MSAi1 through MSAi4, where i=1, 2, 3 and 4), each consisting of a plurality of memory cells. A decoder 14 is associated with each of these memory sub-arrays 13 to select a particular word line from the memory sub-array 13 responsive to the pre-decoded signal. In each of these memory segments 11, the bit lines of the respective memory sub-arrays 13 are connected in common to an associated sub-data bus DQAn (where n=1, 2, 3 and 4). Each memory segment 11 further includes a data bus switching circuit 21 for electrically connecting corresponding pairs of signal lines belonging to the associated data bus DQn and sub-data bus DQAn to each other to meet a predetermined relationship. The bit width of the sub-data bus DQAn is 129 bits, which is larger than that of the data bus DQn by one. The connection switching means as defined in the appended claims is made up of the multiplexer 12, data buses DQn and data bus switching circuits 21.

Figure 2:
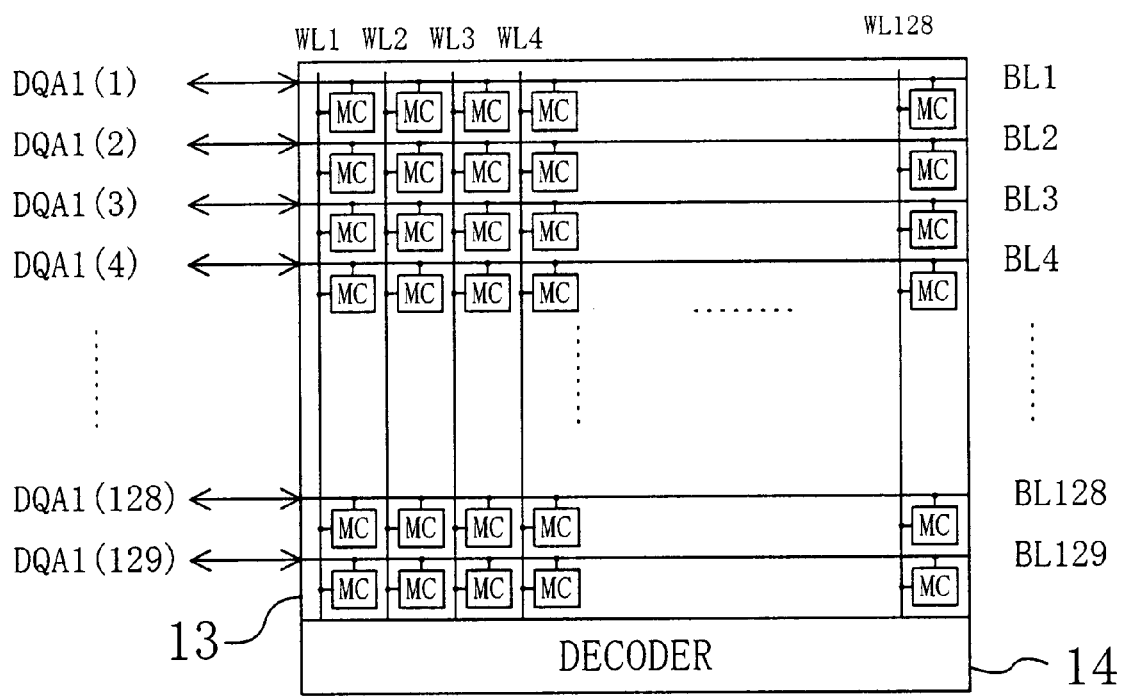
FIG. 2 illustrates an internal configuration for the memory sub-array 13 in the semiconductor memory device shown in FIG. 1.

FIG. 2 illustrates an internal configuration of the memory sub-array 13 (e.g., MSA11, MSA12, MSA13 or MSA14). In FIG. 2, one of word lines WLn (where n=1 through 128) is selected by the decoder 14, and data is transferred to memory cells MC through bit lines BLn (where n=1 through 129). That is to say, each of these memory cells MC is connected to an associated one of the word lines WLn and an associated one of the bit lines BLn. 129 memory cells MC are connected to each single word line WLn and are accessible through corresponding bit lines BLn. These bit lines BLn are connected to associated sub-data bus signal lines DQA1(n) (where n=1 through 129).

Hereinafter, the operation of the semiconductor memory device shown in FIG. 1 will be described. In the following example, the input address is supposed to be zero, and the word line WL1 in the memory sub-array MSA11 is supposed to have been enabled by the pre-decoder 3 and an associated decoder 14.

If there are no defects in memory cells or bit lines in the memory segment 11 including the memory sub-array MSA11, the data bus switching circuit 21 connects the data bus signal lines DQ1[128:1] to the associated sub-data bus signal lines DQA1[128:1]. That is to say, the other one sub-data bus signal line DQA1(129) is not connected to the data bus DQ1. The data bus DQ1 is further connected to the internal data bus 10 by way of the data bus multiplexer 12.

As a result, all of the 129 memory cells MC connected to the word line WL1 but one (i.e., the memory cell MC connected to the sub-data bus signal line DQA1(129) through the bit line BL129) are accessible.

The data bus switching circuit 21 is pre-programmed during product testing such that defective memory cells or bit lines in the memory segment 11 including the memory sub-array MSA11 will not be accessed. For example, suppose there are some defects in the bit line BL3 or memory cells MC connected to the bit line BL3 in the memory sub-array MSA11. In such a case, the data bus switching circuit 21 is programmed in such a manner as to connect the data bus signal lines DQ1[2:1] to the sub-data bus signal lines DQA1[2:1] and the data bus signal lines DQ1[128:3] to the sub-data bus signal lines DQA1[129:4], respectively.

As a result, the data bus DQ1 is not connected to the sub-data bus signal line DQA1(3) and the defective bit line BL3 connected thereto. Since the defective portions are not accessed, all of the 129 memory cells MC connected to the word line WL1 but one (i.e., the memory cell MC connected to the bit line BL3) are accessible.

By providing bit lines and associated memory cells in a number exceeding that of simultaneously accessible bits for each memory sub-array 13 and adaptively changing the connection between the data bus and the bit lines using the preprogrammed data bus switching circuit 21, the defective portions are not accessed. In this manner, a semiconductor memory device with defects can be repaired.

Also, in this embodiment, a semiconductor memory device with defects can be repaired more efficiently than the conventional technique. According to the conventional address-based replacement technique, all of the memory cells that are accessed by a single address specified are replaced as well as a defective one. For example, if the conventional technique is applied to the memory device shown in FIG. 1, then an extra memory segment 11 should be provided to substitute for the entire memory segment 11 with defects. That is to say, since an additional memory segment is needed to repair just one bit defect, the memory array 1 will increase its area by as much as several tens percent. Thus, this repair technique is far from being efficient.

In contrast, according to this embodiment, the number of bit lines per memory sub-array 13 should be larger than the number of simultaneously accessible bits by just one. Accordingly, if 128 bits are to be accessed simultaneously, for example, then each memory sub-array 13 should increase its area by as small as about 0.8% (=1/128). Thus, repair efficiency increases by leaps and bounds.

In the foregoing embodiment, the number of bits accessible simultaneously responsive to a single address specified is 128, while the bit width of the sub-data bus DQAn within the memory segment is 129. The present invention, however, is in no way limited to such a specific embodiment. The number of bits accessible simultaneously by a single address specified may be 64, 256, 1024, etc. Also, the bit width of the sub-data bus DQAn within the memory segment 11 may exceed the number of accessible bits by 2, 3 or more.

Figure 3:
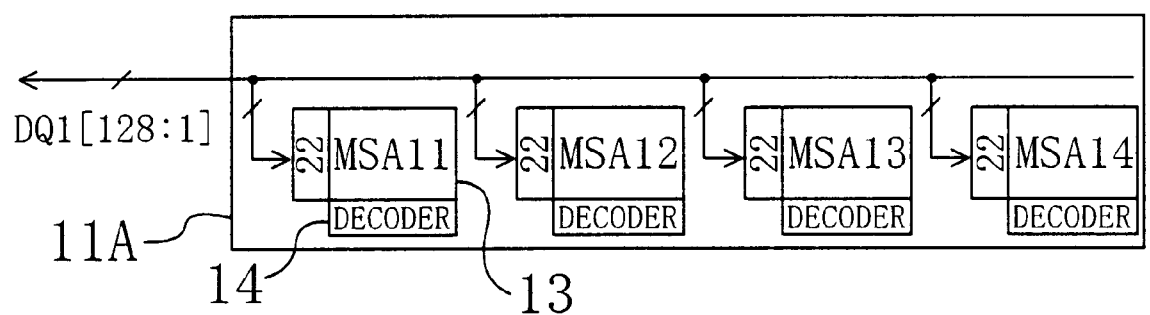
FIG. 3, illustrates another exemplary configuration for the memory segment 11 in the semiconductor memory device shown in FIG. 1.

FIG. 3 illustrates another exemplary memory segment 11A for the semiconductor memory device shown in FIG. 1. The memory segment 11A shown in FIG. 3 corresponds to the memory segment 11 on the first row in the memory array 1 shown in FIG. 1. The memory segment 11A shown in FIG. 3 includes four memory sub-arrays 13 (MSA11 through MSA14) and our decoders 14 and data bus switching circuits 22 associated with the respective memory sub-arrays 13. Each of these data bus switching circuits 22 electrically connects one of the signal lines of the data bus DQ1 to an associated bit line BL in the corresponding memory sub-array 13 so as to meet a predetermined relationship.

Hereinafter, it will be described how the semiconductor memory device shown in FIG. 1 operates if the memory segments 11 shown in FIG. 1 are replaced with the memory segments 11A shown in FIG. 3. In the following example, the input address is also supposed to be zero and the word line WL1 in the memory sub-array MSA11 is also supposed to have been enabled by the pre-decoder 3 and associated decoder 14.

If there are no defects in the memory cells or bit lines in the memory sub-array MSA11, the data bus switching circuit 22 associated with the memory sub-array MSA11 connects the data bus signal lines DQ1[128:1] to the associated bit lines BL[128:1] in the memory sub-array MSA11. That is to say, the other one bit line BL129 is not connected to the data bus DQ1. As a result, the 128 memory cells MC are all accessible through the connected bit lines BL[128:1].

The data bus switching circuit 22 associated with the memory sub-array MSA11 is pre-programmed during product testing such that defective memory cells or bit lines in the memory sub-array MSA11 will not be accessed. For example, suppose there are some defects in the bit line BL3 or memory cells MC connected to the bit line BL3 in the memory sub-array MSA11. In such a case, the data bus switching circuit 22 is programmed to connect the data bus signal lines DQ1[2:1] to the bit lines BL[2:1] and the data bus signal lines DQ1[128:3] to the bit lines BL[129:4], respectively.

As a result, the data bus DQ1 is not connected to the defective bit line BL3. Since the defective portions are not accessed, all of the 129 memory cells MC connected to the word line WL1 but one (i.e., the memory cell MC connected to the bit line BL3) are accessible.

Figure 4A:
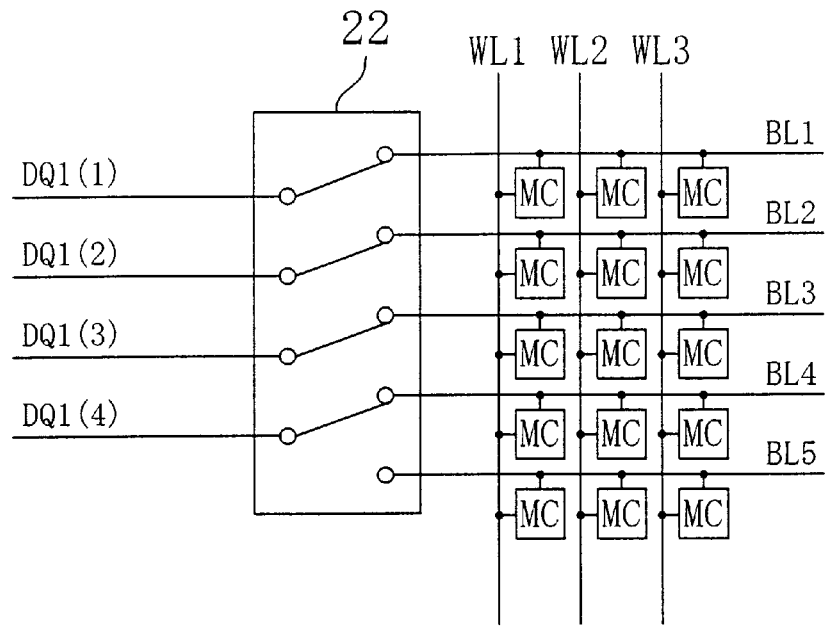
FIGS. 4(a) and 4(b) illustrate how a data bus switching circuit switches connection between data bus signal lines and bit lines.
Figure 4B:
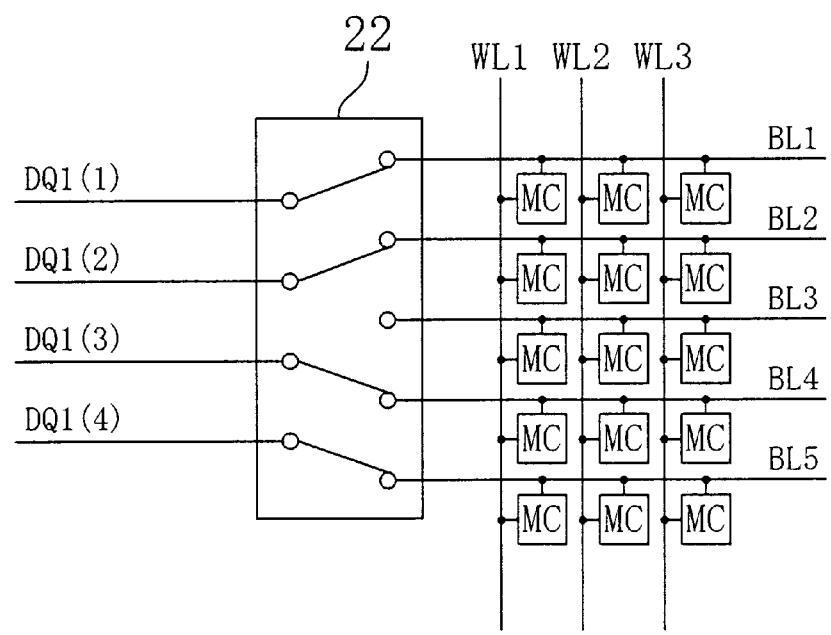

FIGS. 4(a) and 4(b) schematically illustrate how the data bus switching circuit 22 switches connection between the data bus DQ1 and the bit lines BL. FIG. 4(a) illustrates a situation where there are no defects in the bit lines or memory cells. In such a case, the data bus switching circuit 22 connects the data bus signal lines DQ1(1) through DQ1(4) to the bit lines BL1 through BL4, respectively. On the other hand, FIG. 4(b) illustrates a situation where there are some defects in the bit line BL3 or memory cells MC connected thereto. In such a case, the data bus switching circuit 22 connects the data bus signal lines DQ1(1), DQ1(2), DQ1(3) and DQ1(4) to the bit lines BL1, BL2, BL4 and BL5, respectively. In this manner, the bit line BL3 with defects is not accessed.

By providing the data bus switching circuits 22 for the respective memory sub-arrays 13 as shown in FIG. 3, defective parts can be repaired on the sub-array by sub-array basis.

Specifically, in the memory device shown in FIG. 1, only one data bus switching circuit 21 is provided for each memory segment 11. Accordingly, if defects are found in a plurality of bit lines with mutually different line numbers in several memory sub-arrays 13 of a single memory segment 11, then not all of these defective bit lines can be repaired under the configuration shown in FIG. 1. The memory device shown in FIG. 1 can repair only one defective component within a single memory sub-array 13 or a plurality of defective bit lines with the same line number in several memory sub-arrays 13.

In the configuration shown in FIG. 3 on the other hand, the data bus switching circuits 22 are provided for the respective memory sub-arrays 13. Thus, connection can be established between the data bus DQn and the bit lines BL of each memory sub-array. That is to say, even when defects are found in a plurality of bit lines with different line numbers in several memory sub-arrays 13 of a single memory segment 11, these defective parts can be repaired, too.

In the foregoing embodiment, even if there are any defects in the bit line BL129 or memory cells MC connected thereto, the data bus DQn may be connected to the sub-data bus DQAn or bit lines BL in the same way as the situation where no defects are found therein.

Next, exemplary specific configurations of the data bus switching circuit 21 or 22 according to the present invention will be described.

Figure 5:
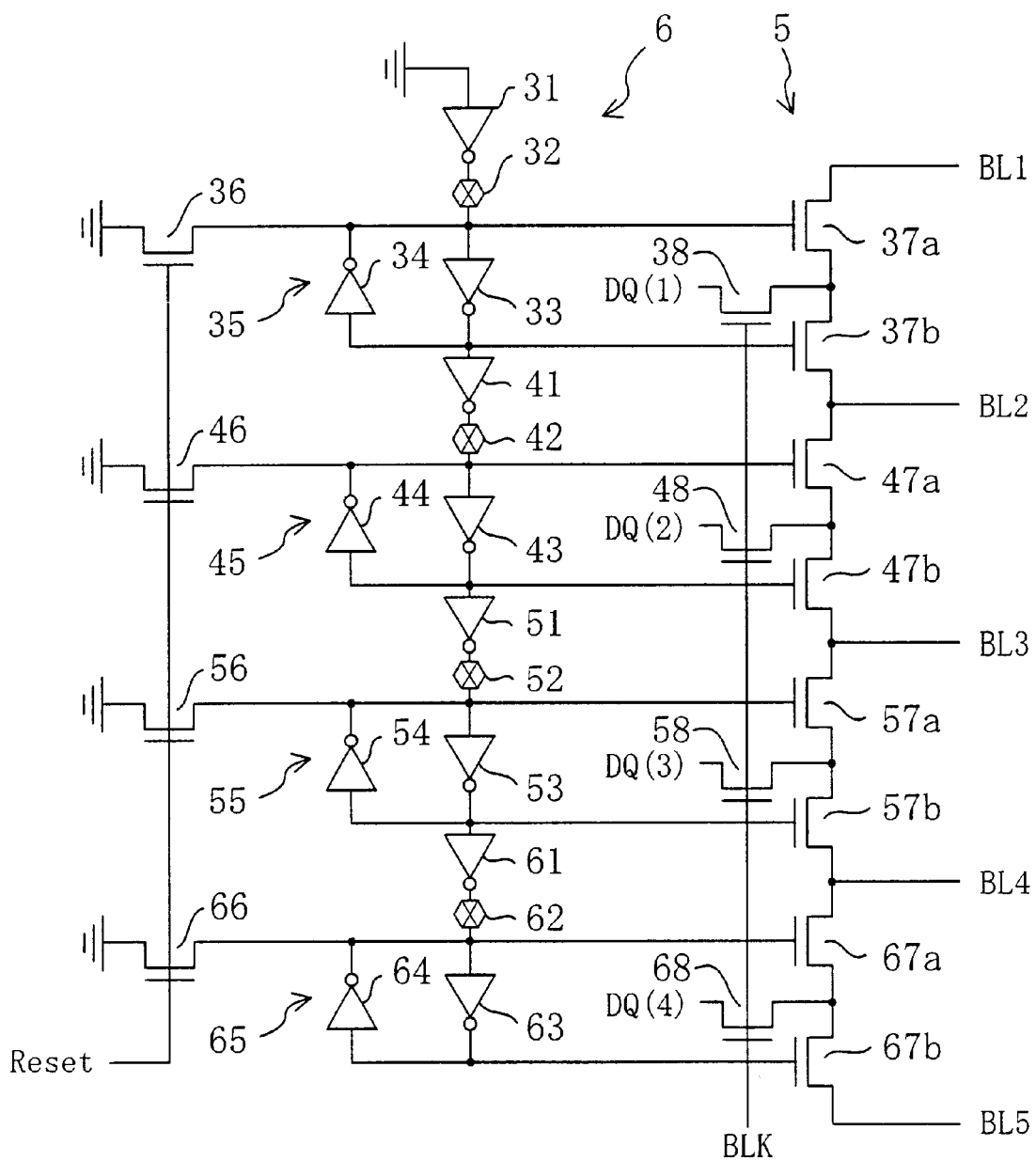
FIG. 5 is a circuit diagram illustrating a specific configuration for a signal line switching circuit according to an exemplary embodiment of the present invention.

FIG. 5 illustrates a specific configuration for a data bus switching circuit implemented as an exemplary signal line switching circuit according to the present invention. The signal line switching circuit shown in FIG. 5 is applicable as the data bus switching circuit 22 shown in FIG. 3, in which a first group of signal lines, i.e., four data bus signal lines DQ(1) through DQ(4), are electrically connected to associated ones of a second group of signal lines, i.e., five bit lines BL1 through BL5.

As shown in FIG. 5, the signal line switching circuit includes a switch section 5 for establishing an electrically connected or disconnected state between the four data bus signal lines DQ(1) through DQ(4) and the five bit lines BL1 through BL5. The switching circuit further includes a switch control section 6 for controlling the switch section 5 in accordance with the terminal potentials of respective fuses 32, 42, 52 and 62 connected in series to each other.

The switch control section 6 provides a latch circuit 35 and an n-channel MOS transistor 36 for the fuse 32. The latch circuit 35 includes two inverters 33 and 34, which are connected in parallel and in opposite directions to each other for latching the terminal potential of the fuse 32. The n-channel MOS transistor 36 receives a reset signal Reset at its gate, thereby initializing the latched potential of the latch circuit 35 at "L" level. The output of another inverter 31 receiving a ground potential, i.e., "H" level potential, is applied as a predetermined potential to the fuse 32.

Similarly, latch circuits 45, 55 and 65 and n-channel MOS transistors 46, 56 and 66 are provided for the other three fuses 42, 52 and 63, respectively. The fuses 42, 52 and 62 are connected to the latch circuits 35, 45 and 55 on the previous stages via inverters 41, 51 and 61, respectively.

The switch section 5 provides a pair of n-channel MOS transistors 37a and 37b, which together form a first group of switches, between the bit lines BL1 and BL2 for the data bus signal line DQ(1). Responsive to the potential latched by the latch circuit 35, the n-channel MOS transistors 37a and 37b establish electrical connection/disconnection between the data bus signal line DQ(1) and the bit lines BL1 and BL2. If the potential at the input terminal of the latch circuit 35, i.e., the potential latched as the terminal potential of the fuse 32, is at the "H" level, then the n-channel MOS transistor 37a turns ON. In this case, since the potential at the output terminal of the latch circuit 35 is at the "L" level, the n-channel MOS transistor 37b turns OFF. As a result, the data bus signal line DQ(1) is electrically connected to the bit line BL1, not to the other bit line BL2. Alternatively, if the potential at the input terminal of the latch circuit 35 is at the "L" level, then the n-channel MOS transistor 37a turns OFF but the n-channel MOS transistor 37b turns ON. As a result, the data bus signal line DQ(1) is electrically connected to the bit line BL2, not to the other bit line BL1.

Similarly, the switch section 5 further provides three other pairs of n-channel MOS transistors 47a and 47b, 57a and 57b and 67a and 67b, which together form second, third and fourth groups of switches, between the bit lines BL2 and BL3, BL3 and BL4 and BL4 and BL5 for the data bus signal lines DQ(2), DQ(3) and DQ(4), respectively.

The switching circuit further includes n-channel MOS transistors 38, 48, 58 and 68, which function as respective switches for connecting bit lines in the selected memory sub-array to the associated data bus signal lines and receive a signal BLK for selecting the sub-array.

Hereinafter, the operation of the data bus switching circuit shown in FIG. 5 will be described.

First, when the device is powered, the reset signal Re-set is asserted to the "H" level, thereby turning the nhannel MOS transistors 36, 46, 56 and 66 ON functioning as initializing means. As a result, the respective potentials latched at the input terminals of the latch circuits 35, 45, 55 and 65 are once initialized at the "L" level.

If there are no defects in the bit lines BL1 through BL4 or in the memory cells connected thereto, then none of the fuses 32, 42, 52 and 62 are cut off and the data bus switching circuit 22 is operable as it is. Thus, the respective latch circuits 35, 45, 55 and 65 latch the signals, the levels of which are determined by the outputs of the inverters 31, 41, 51 and 61 irrespective of the initialized latched potentials. Specifically, since the inverter 31 receives the ground potential, the output thereof is the "H" level potential. That is to say, the potential at the input terminal of the latch circuit 35 is at the "H" level, while the potential at the output terminal thereof is at the "L" level. Since the inverter 41 receives the output of the latch circuit 35 (i.e., the "L" level potential), the output thereof is the "H" level potential. That is to say, the potential at the input terminal of the latch circuit 45 is at the "H" level, while the potential at the output terminal thereof is at the "L" level. In the same way, the potentials at the input and output terminals of the latch circuit 55, 65 are at the "H" and "L" levels, respectively.

As a result, the n-channel MOS transistors 37a, 47a, 57a and 67a turn ON, while the n-channel MOS transistors 37b, 47b, 57b and 67b turn OFF. That is to say, the data bus signal lines DQ(1) through DQ(4) are electrically connected to the bit lines BL1 through BL4, respectively.

On the other hand, if there are any defects in the bit lines BL1 through BL4 or in the memory cells connected thereto, then one of the fuses 32, 42, 52 and 62 should be cut off. Supposing there is some defect in the bit line BL3 or in memory cells connected thereto, the fuse 52 should be cut off by laser trimming, for example.

Once the fuse 52 has been cut off, the output signal of the inverter 51 is not transmitted to the latch circuits 55 and 65 on the stages succeeding the fuse 52. Accordingly, the latch circuits 55 and 65 latch the potentials as initialized. That is to say, the potentials at the input and output terminals of the latch circuits 35 and 45 preceding the fuse 52 cut off are at the "H" and "L" levels, respectively. On the other hand, the potentials at the input and output terminals of the latch circuits 55 and 65 succeeding the fuse 52 are at the "L" and "H" levels, respectively.

As a result, the n-channel MOS transistors 37a, 47a, 57b and 67b turn ON, while the n-channel MOS transistors 37b, 47b, 57a and 67a turn OFF. That is to say, the data bus signal lines DQ(1) through DQ(4) are electrically connected to the bit lines BL1, BL2, BL4 and BL5, respectively. The defective bit line BL3 is connected to none of the data bus signal lines DQ(1) through DQ(4). Instead, the redundant bit line BL5 is connected to the data bus signal line DQ(4). In this manner, a semiconductor memory device with defects can be repaired.

In the conventional data bus switching circuit like this, a plurality of fuses are generally connected in series between power supply and ground (see, for example, FIG. 12 of Japanese Laid-Open Publication No. 5-334898).

In an actual test process, however, fuses could not be cut off completely for various reasons. For example, the beam emitted from a laser light source might be out of focus or might be of an insufficient intensity. In such a case, the half-cut fuse becomes a high-resistance element. As a result, in the conventional arrangement, the nodes succeeding the half-cut fuse are not isolated from the power supply, but remain connected to the power supply by way of the high-resistance fuse. Thus, although the logical states should be inverted for the potentials at respective nodes succeeding the fuse cut off, those potentials show intermediate levels or get equal to the supply potential near the power supply because the fuse has not been cut off completely. Accordingly, if the target fuse has not been cut off completely in the conventional arrangement, the switching circuit cannot operate normally.

In contrast, in the arrangement shown in FIG. 5, the respective fuses 32, 42, 52 and 62 are not directly connected to the power supply as in the conventional arrangement, but indirectly via the inverters. The fuse 32 on the first stage is driven by an MOS transistor functioning as the inverter 31 based on the ground potential. And the fuses 42, 52 and 62 on the second, third and fourth stages are driven by respective MOS transistors functioning as the inverters 41, 51 and 61 based on the terminal potentials of the fuses 32, 42 and 52 on the previous stages. Accordingly, even if some fuse has not been cut off completely due to a focus error of the laser light source, for example, the data bus switching circuit shown in FIG. 5 can still operate normally.

For example, suppose the fuse 52 has not been cut off completely. In such a case, the gate of the n-channel MOS transistor 57a is connected to the power supply via the halfcut fuse 52 and a transistor functioning as the inverter 51, and is also connected to the ground via another transistor functioning as the inverter 54. Since the incompletely cut fuse 52 shows very high resistance, the gate potential of the n-channel MOS transistor 57a gets closer the ground potential and is represented as the "L" level. That is to say, the latch circuit 55 can correctly latch an "L" level signal at the input terminal thereof.

Also, since inverters are interposed between adjacent fuses, the impedance as measured from the power supply is the same irrespective of the locations of the fuses. Accordingly, the reliability of the data bus switching circuit can be improved.

Figure 6:
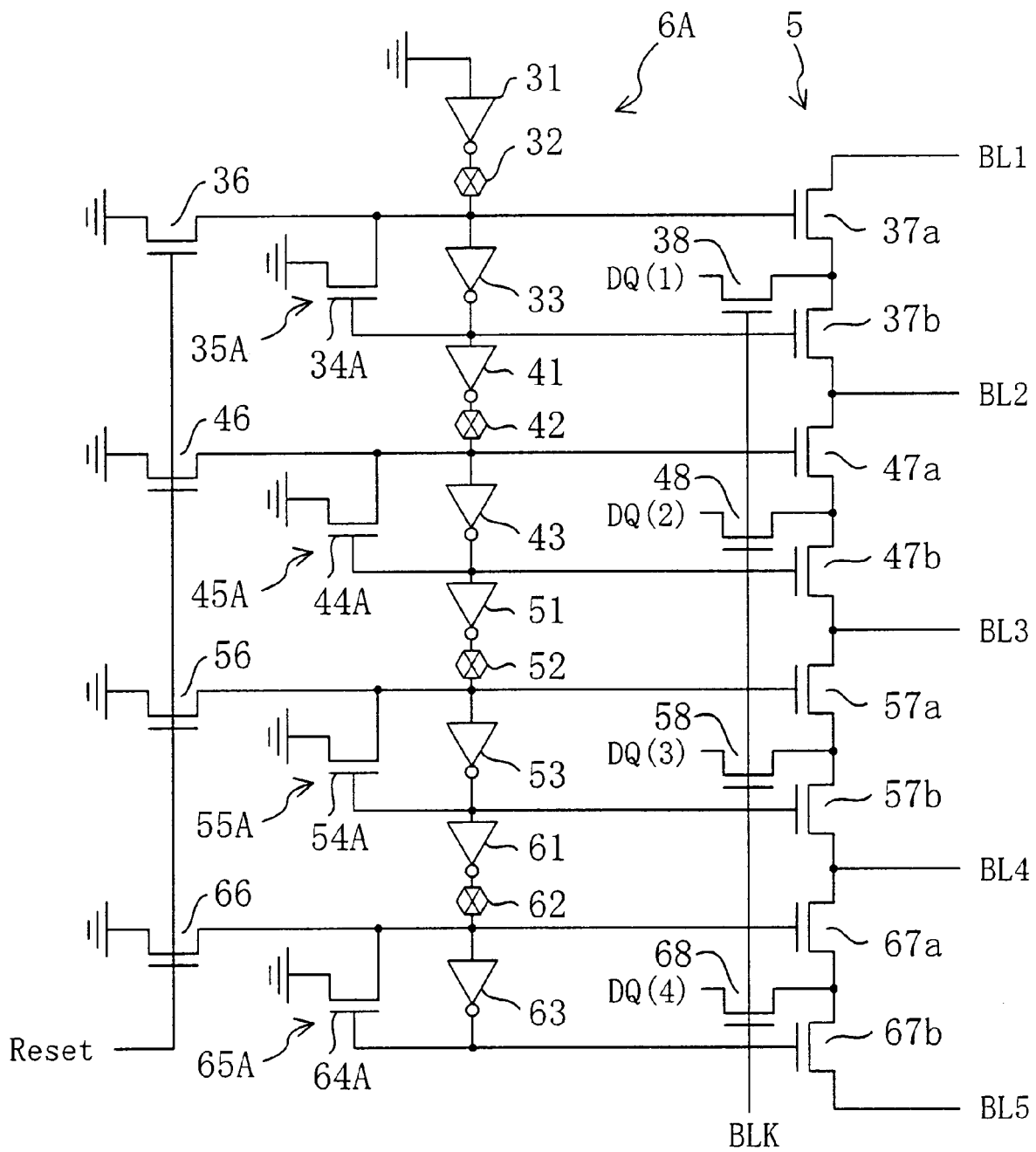
FIG. 6 is a circuit diagram showing a modified example of the signal line switching circuit shown in FIG. 5.

FIG. 6 is a circuit diagram illustrating a modified example of the data bus switching circuit shown in FIG. 5. In FIG. 6, the same components as those illustrated in FIG. 5 are identified by the same reference numerals. The switching circuit shown in FIG. 6 is different from the switching circuit shown in FIG. 5 in that each latch circuit 35A, 45A, 55A, 65A is made up of an inverter and an n-channel MOS transistor in a switch control section 6A. For instance, the latch circuit 35A on the first stage includes: an inverter 33 connected in series to the fuse 32; and an n-channel MOS transistor 34A, which receives the output of the inverter 33 at its gate. The drain potential of the transistor 34A is input to the inverter 33.

The data bus switching circuit shown in FIG. 6 operates basically the same way as the counterpart shown in FIG. 5. Specifically, if none of the fuses 32, 42, 52 and 62 are cut off, then the latch circuits 35A, 45A, 55A and 65A latch the "H" level potential at their input terminals irrespective of the initialized latch potential. As a result, the n-channel MOS transistors 37a, 47a, 57a and 67a turn ON, while the n-channel MOS transistors 37b, 47b, 57b and 67b turn OFF. That is to say, the data bus signal lines DQ(1) through DQ(4) are electrically connected to the bit lines BL1 through BL4, respectively.

On the other hand, if any fuse has been cut off, then the latch circuits preceding the fuse latches the "H" level potential at the input terminal, while the latch circuits succeeding the fuse latches the "L" level potential at the input terminal. For example, suppose the fuse 52 has been cut off. Then, the potentials at the input terminals of the latch circuits 35A and 45A are at the "H" level, while the potentials at the input terminals of the latch circuits 55A and 65A are at the "L" level. As a result, the n-channel MOS transistors 37a, 47a, 57b and 67b turn ON, while the n-channel MOS transistors 37b, 47b, 57a and 67a turn OFF. That is to say, the data bus signal lines DQ(1) through DQ(4) are electrically connected to the bit lines BL1, BL2, BL4 and BL5, respectively.

In the configuration shown in FIG. 6, the number of transistors can be reduced by one in each latch circuit 35A, 45A, 55A, 65A. Thus, the layout process can be performed more efficiently.

Figure 7:
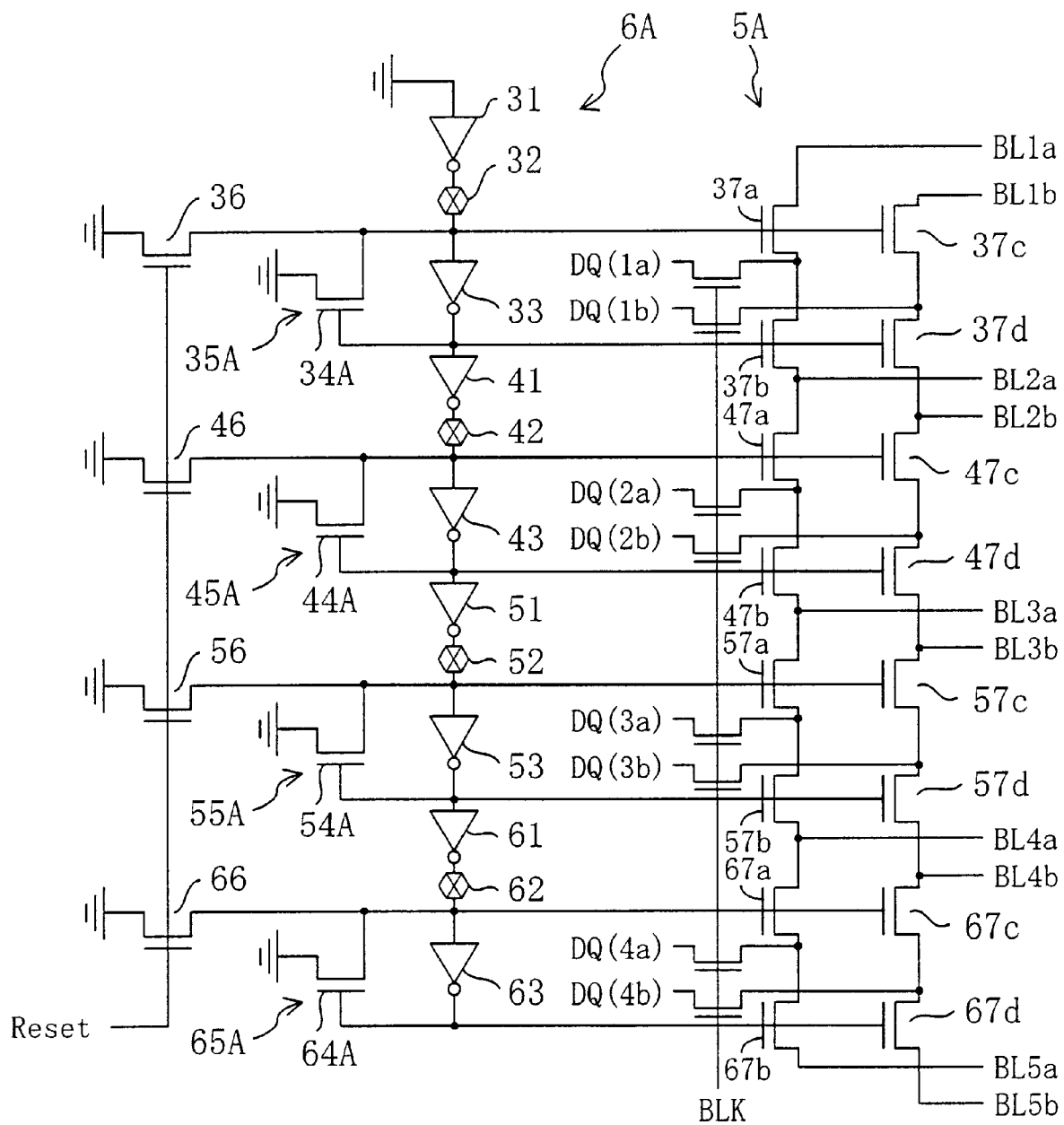
FIG. 7 is a circuit diagram showing a modified example of the signal line switching circuit shown in FIG. 6.

FIG. 7 is a circuit diagram illustrating a modified example of the data bus switching circuit shown in FIG. 6. In FIG. 7, the same components as those illustrated in FIG. 6 are identified by the same reference numerals. The witching circuit shown in FIG. 7 is different from the switching circuit shown in FIG. 6 in that each data bus signal line DQn or bit line BL is subdivided into a pair of signal lines. That is to say, the switch section 5A establishes an electrical connection state between four pairs of data bus signal lines DQ(1a) and DQ(1b), DQ(2a) and DQ(2b), DQ(3a) and DQ(3b) and DQ(4a) and DQ(4b) and five pairs of bit lines BL1a and BL1b, BL2a and BL2b, BL3a and BL3b, BL4a and BL4b and BL5a and BL5b. Specifically, to define electrical connection between a pair of data bus signal lines DQ and two pairs of bit lines BL, four n-channel MOS transistors are provided for each latch circuit.

For example, n-channel MOS transistors 37a, 37b, 37c and 37d are provided as a first group of switches between the two pairs of bit lines BL1a and BL1b and BL2a and BL2b for the pair of data bus signal lines DQ(1a) and DQ(1b). The potential at the input terminal of the latch circuit 35A is applied to the gate of the n-channel MOS transistor 37a provided between the data bus signal line DQ(1a) and the bit line BL1a and to the gate of the n-channel MOS transistor 37c provided between the data bus signal line DQ(1b) and the bit line BL1b. On the other hand, the potential at the output terminal of the latch circuit 35A is applied to the gate of the n-channel MOS transistor 37b provided between the data bus signal line DQ(1a) and the bit line BL2a and to the gate of the n-channel MOS transistor 37d provided between the data bus signal line DQ(1b) and the bit line BL2b.

In this configuration, if the potentials at the input and output terminals of the latch circuit 35A are at the "H" and "L" levels, then the data bus signal lines DQ(1a) and DQ(1b) are connected to the bit lines BL1b and BL1b, respectively. On the other hand, if the potentials at the input and output terminals of the latch circuit 35A are at the "L" and "H" levels, then the data bus signal lines DQ(1a) and DQ(1b) are connected to the bit lines BL2a and BL2b, respectively.

The data bus switching circuit shown in FIG. 7 repairs defective components slightly less efficiently. However, since only one fuse should be provided for a pair of data bus signal lines DQn (i.e., two signal lines), the number of fuses may be half of the number of data bus signal lines. As a result, the switching efficiency of the data bus switching circuit can be improved.

In the configuration shown in FIG. 7, the data bus signal lines DQn and bit lines BL are selectively connected on the basis of two signal lines. Alternatively, switching may be performed on a three or more signal lines basis. Also, the switch section 5 shown in FIG. 5 may be replaced with the switch section 5A shown in FIG. 7.

Figure 8:
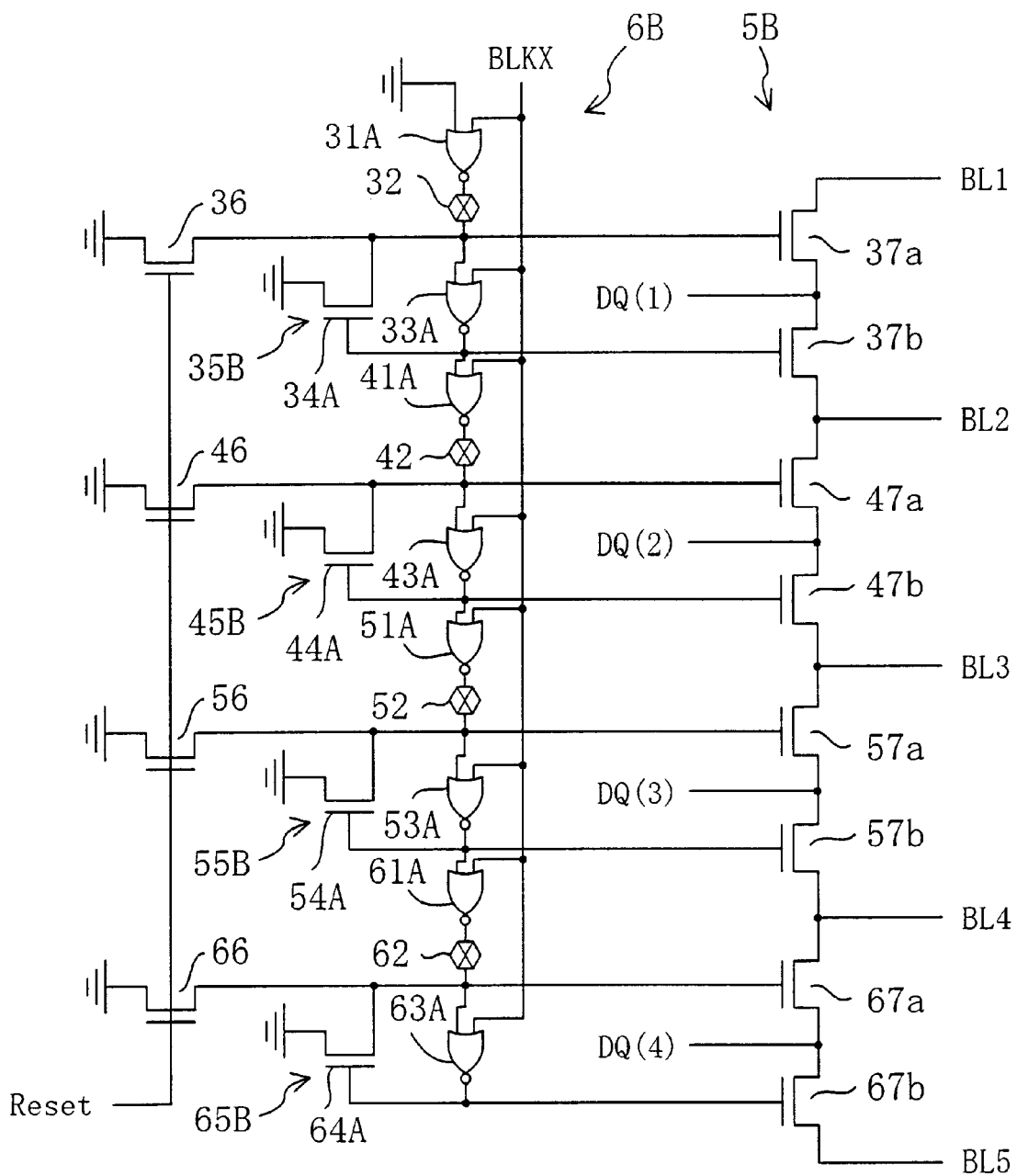
FIG. 8 is a circuit diagram showing another modified example of the signal line switching circuit shown in FIG. 6.

FIG. 8 is a circuit diagram illustrating another modified example of the data bus switching circuit shown in FIG. 6. In FIG. 8, the same components as those illustrated in FIG. 6 are identified by the same reference numerals. The switching circuit shown in FIG. 8 is different from the switching circuit shown in FIG. 6 in that selection of a memory sub-array and switching of redundant components are both performed by a single switch. Specifically, the respective inverters 31, 33, 41, 43, 51, 53, 61 and 63 in the switch control section 6A shown in FIG. 6 are replaced with NOR gates 31A, 33A, 41A, 43A, 51A, 53A, 61A and 63A in the switch control section 6B. Each of the NOR gates receives at one of its input terminals a selection signal BLKX indicating whether or not the circuit should be activated upon the selection of the memory sub-array. Thus, the n-channel MOS transistors 38, 48, 58 and 68 used for selecting the memory sub-array are omitted from the data bus switching circuit shown in FIG. 8.

If the signal BLKX is asserted at the "H" level, then the outputs of the respective NOR gates 31A, 33A, 41A, 43A, 51A, 53A, 61A and 63A are at the "L" level. Alternatively, if the signal BLKX is negated at the "L" level, then the respective NOR gates 31A, 33A, 41A, 43A, 51A, 53A, 61A and 63A operate as inverters. Thus, the memory sub-array can also be selected responsive to the signal BLKX as well as the signal BLK for the switching circuit shown in FIG. 6. Also, in the switching circuit shown in FIG. 8, the switches interposed between each data bus signal line DQ and associated bit lines BL can be reduced by one. As a result, the impedance of the data bus signal line DQ can be cut down, and therefore, access can be speeded up. In the switching circuit shown in FIG. 8, the reset signal Reset may be input after the signal BLKX has settled its level, not when the circuit is powered. In this manner, the data bus signal lines can be switched normally.

In the data bus switching circuit shown in FIG. 5, the switch control section 6 and the switch section 5 may be replaced with the switch control section 6B and the switch section 5B shown in FIG. 8, respectively.

Figure 9:
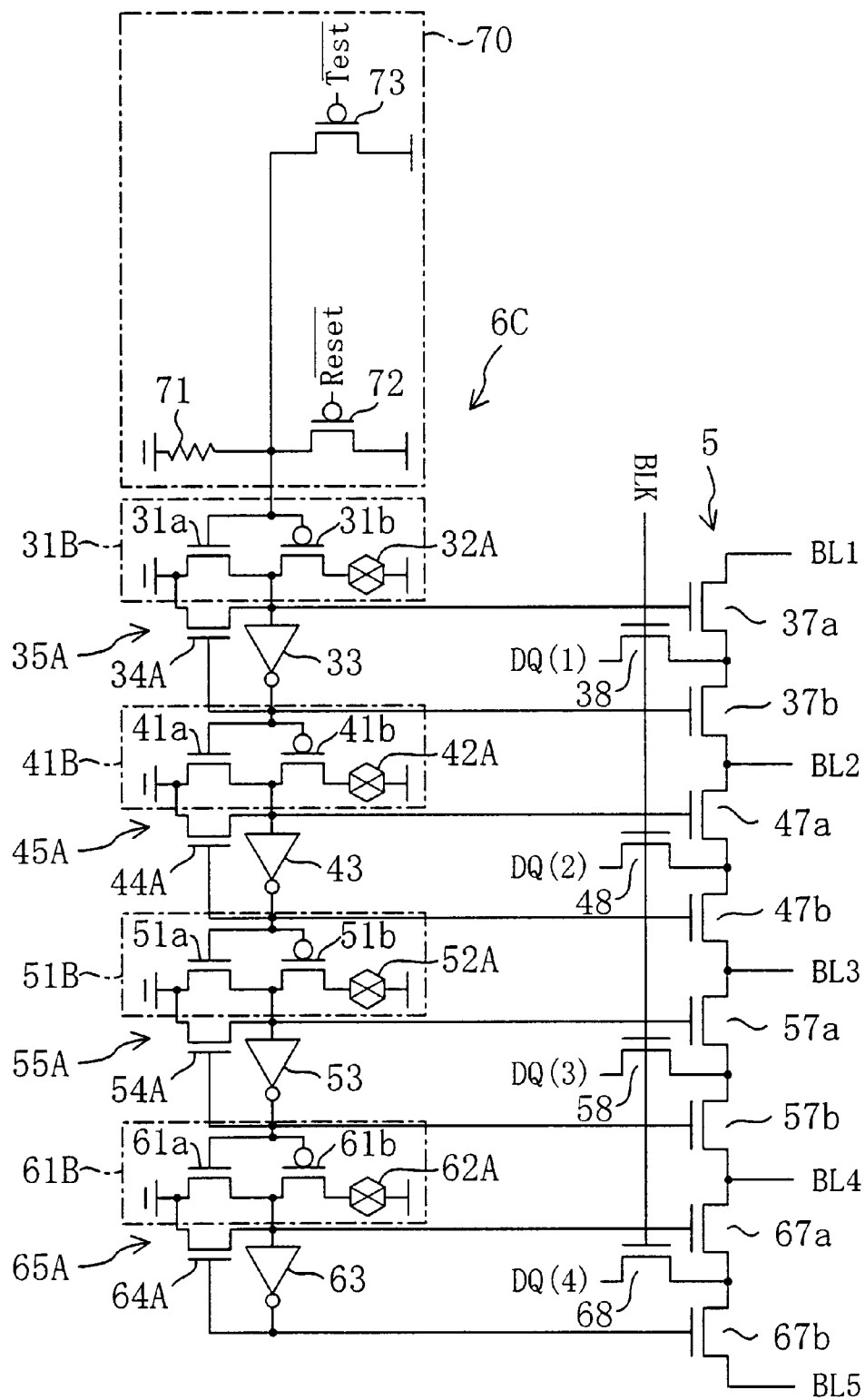
FIG. 9 is a circuit diagram showing still another modified example of the signal line switching circuit shown in FIG. 6.
Figure 10:
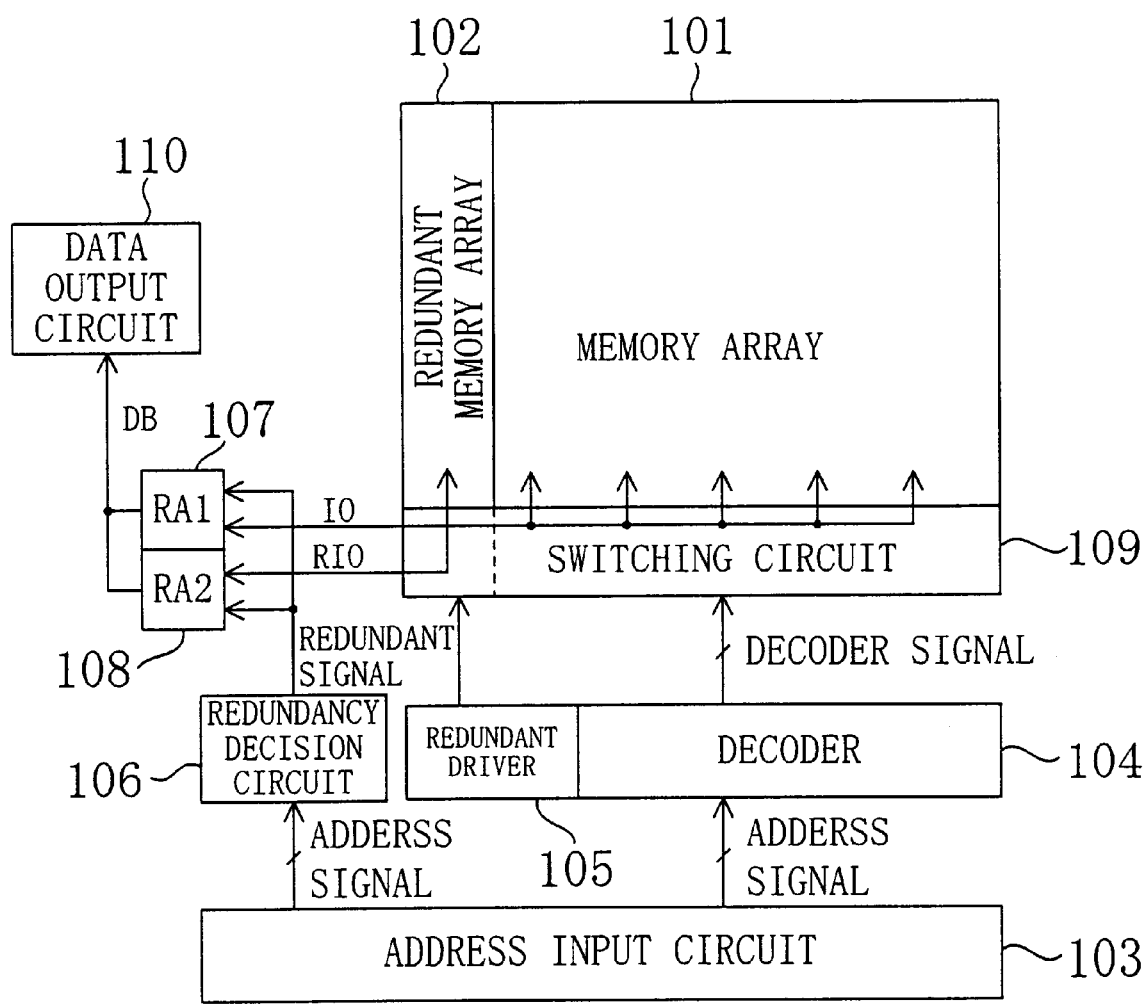
FIG. 10 is a block diagram illustrating a configuration for a conventional semiconductor memory device with redundancy function.

FIG. 9 is a circuit diagram illustrating still another modified example of the data bus switching circuit shown in FIG. 6. In FIG. 9, the same components as those illustrated in FIG. 6 are identified by the same reference numerals.

The switching circuit shown in FIG. 9 is different from the switching circuit shown in FIG. 6 in the following respects. In a switch control section 6C, fuses 32A, 42A, 52A and 62A are inserted between the respective sources of p-channel MOS transistors 31b, 41b, 51b and 61b and the power supply. The p-channel MOS transistors 31b, 41b, 51b and 61b are included in first- through fourth-stage control inverters 31B, 41B, 51B and 61B, respectively, which are connected in series to each other. Also, the outputs of these control inverters 31B, 41B, 51B and 61B are directly input to individual latch circuits 35A, 45A, 55A and 65A, respectively.

The data bus switching circuit shown in FIG. 9 further includes a pull-down resistor 71, which is an exemplary drive potential applying means, and a p-channel MOS transistor 72, which is an exemplary initializing means. Specifically, when an inverted reset signal /Reset is negated at the "H" level, the pull-down resistor 71 applies an "L"-level drive potential to the input of the first-stage control inverter 31B. The p-channel MOS transistor 72 receives the inverted reset signal /Reset at its gate and applies an "H"-level initializing potential to the input of the first-stage control inverter 31B when the inverted reset signal /Reset is asserted at the "L" level. In the configuration shown in FIG. 9, the p-channel MOS transistor 72 is provided as initializing means for only the input of the first-stage control inverter 31B, not for each latch circuit 35A, 45A, 55A, 65A.

The switching circuit shown in FIG. 9 further includes a p-channel MOS transistor 73 receiving a test control signal /Test and applying an "H"-level potential to the input of the first-stage control inverter 31B when the test control signal is asserted at the "L" level. When the test control signal is negated at the "H" level, the pull-down resistor 71 applies the "L"-level potential to the input of the first-stage control inverter 31B. The pull-down resistor 71 and the p-channel MOS transistors 72 and 73 together constitute potential applying means.

Hereinafter, the operation of the data bus switching circuit shown in FIG. 9 will be described.

First, when the switching circuit is powered, the inverted reset signal /Reset is asserted at the "L" level to turn the p-channel MOS transistor 72 ON. As a result, the "H"-level potential is applied as an initializing potential to the input of the first-stage control inverter 31B, thereby turning an n-channel MOS transistor 31a on the ground side ON and the p-channel MOS transistor 31b on the power supply side OFF. The fuse 32A is inserted between the p-channel MOS transistor 31b and the power supply. Accordingly, the output of the first-stage control inverter 31B is once initialized at the "L" level no matter whether the fuse 32A has been cut off or not.

The "L"-level output of the first-stage control inverter 31B is inverted by the inverter 33 into the "H" level, which drives the second-stage control inverter 41B. In a similar manner, the respective outputs of the second, third and fourth-stage control inverters 41B, 51B and 61B are also once initialized at the "L" level.

Next, the inverted reset signal /Reset is negated at the "H" level to turn the p-channel MOS transistor 72 OFF. Then, or in the memory cells connected thereto, then the fuses 32A, 42A, 52A and 62A are not cut off and the data bus switching circuit shown in FIG. 9 is used as it is. In such a case, the respective latch circuits 35A, 45A, 55A and 65A latch the outputs of the control inverters 31B, 41B, 51B and 61B irrespective of the initialized latch potentials.

Since the output of the first-stage control inverter 31B is at the "H" level, the potentials of the latch circuit 35A at the input and output terminals thereof are at the "H" and "L" levels, respectively. Since the second-stage control inverter 41B receives the "L"-level output of the latch circuit 35A, the output of the second-stage control inverter 41B is at the "H" level. As a result, the potentials of the latch circuit 45A at the input and output terminals thereof are at the "H" and "L" levels, respectively. Similarly, the potentials of the latch circuit 55A, 65A at the input and output terminals thereof are at the "H" and "L" levels, respectively.

As a result, the n-channel MOS transistors 37a, 47a, 57a and 67a are turned ON in the switch section 5, thereby electrically connecting the data bus signal lines DQ(1) through DQ(4) to the bit lines BL1 through BL4, respectively.

On the other hand, if there are any defects in the bit lines BL1 through BL4 or in the memory cells connected thereto, one of the fuses 32A, 42A, 52A, 62A is cut off. Suppose there is a defect in the bit line BL3 or in the memory cells connected thereto and the fuse 52A should be cut off.

Once the fuse 52A has been cut off, the source of the p-channel MOS transistor 51b on the power supply side is disconnected from the power supply in the third-stage control inverter 51B and a current path between the power supply and the output terminal is cut off. Accordingly, even if the "L"-level potential is input to the third-stage control inverter 51B, the output thereof is not inverted into the "H" level. Thus, the potentials of the latch circuit 55A at the input and output terminals thereof remain the "L" and "H" levels, respectively. That is to say, the potentials of the latch circuits 35A and 45A at the input and output terminals thereof, which precede the third-stage control inverter 51B including the fuse 52A cut off, are the "H" and "L" levels. On the other hand, the potentials of the latch circuits 55A and 65A at the input and output terminals thereof, which succeed the third-stage control inverter 51B, are the "L" and "H" levels.

As a result, the n-channel MOS transistors 37a, 47a, 57b and 67b turn ON in the switch section 5, thereby electrically connecting the data bus signal lines DQ(1) through DQ(4) to the bit lines BL1, BL2, BL4 and BL5, respectively. The defective bit line BL3 is connected to none of the data bus signal lines DQ(1) through DQ(4). Instead, the redundant bit line BL5 is connected to the data bus signal line DQ(4).

In the data bus switching circuit shown in FIG. 9, the initializing transistor need not be provided for each latch circuit, but for only the input of the first-stage control inverter 31B, thus reducing the number of components required. Also, although four transistors are provided as loads for the reset signal Reset in the switching circuit shown in FIG. 6, just one transistor should be provided as a load for the inverted reset signal /Reset for initialization purposes. Since the number of loads can be drastically cut down in this manner, the load capacitance can be reduced.

Hereinafter, it will be described how a GO/NO-GO test is carried out on a semiconductor memory device using the circuit shown in FIG. 9.

Suppose none of the fuses 32A, 42A, 52A and 62A have been cut off. In such a state, if the test control signal /Test is negated at the "H" level, the first-stage control inverter 31B receives the "L"-level potential from the pull-down resistor 71 after the initialization. As a result, the potentials of each latch circuit 35A, 45A, 55A or 65A at the input and output terminals thereof are at the "H" and "L" levels, respectively. If a test is carried out in such a state, then the bit lines BL1 through BL4 can be tested, but the redundant bit line BL5 cannot, because the bit line BL5 is connected to none of the data bus signal lines DQ(1) through DQ(4). Accordingly, it is impossible to see if the semiconductor memory device will operate normally when the bit line BL5 is connected to the data bus signal line DQ(4) by cutting one of the fuses off.

Thus, to decide whether the bit line BL5 is good or bad, a test should be carried out by asserting the test control signal /Test at the "L" level. In such a case, the input potential of the first-stage control inverter 31B is at the "H" level, while the potentials of each latch circuit 35A, 45A, 55A or 65A at the input and output terminals thereof are at the "L" and "H" levels, respectively. As a result, the bit line BL5 is connected to the data bus signal line DQ(4). Thus, the redundant bit line BL5 can be examined.

As can be seen, if a test is carried out with the test control signal /Test negated at the "H" level, then the bit lines BL1 through BL4 can be examined. On the other hand, if a test is carried out with the test control signal /Test asserted at the "L" level, then the redundant bit line BL5 can also be checked. In other words, a test can be performed on all the bit lines BL1 through BL5 without cutting any fuse off. If there is no need to carry out such a test, then the p-channel MOS transistor 73 may be omitted from the circuit.

In the circuit shown in FIG. 9, the fuses 32A, 42A, 52A and 62A are inserted between the p-channel MOS transistors 31b, 41b, 51b and 61b of the respective control inverters 31B, 41B, 51B and 61B and the power supply. However, each of these fuses only needs to be provided at such a position as to cut off a current path between the power supply and the output terminal and thereby prevent the associated control inverter from outputting the "H"-level potential when the fuse is cut off. For example, each fuse may be provided between an associated p-channel MOS transistor and the output terminal of an associated inverter.

The data bus switching circuit shown in FIGS. 5, 6, 7, 8 or 9 may substitute for the data bus switching circuit 21 shown in FIG. 1 to switch connection between data bus signal lines by replacing the bit lines BL with the sub-data buses DQAn. Also, the applications of the data bus switching circuit shown in FIGS. 5, 6, 7, 8 or 9 are not limited to switching connection between a pair of data bus signal lines or between a data bus signal line and an associated bit line. Alternatively, the switching circuit is applicable as means for switching electrical connection between any arbitrary pair of signal line groups.

Moreover, in the data bus switching circuit shown in FIGS. 5, 6, 7, 8 or 9, the fuses do not have to be cut off by laser trimming, but may be of various other types. For example, a nonvolatile memory device may be used as an alternative fuse such that the current path can be electrically cut off.

As is apparent from the foregoing description, if a semiconductor memory device of a multi-bit accessing type includes a defective memory cell associated with an address, the present invention can repair the memory cell on a bit-by-bit basis, not on an address basis. As a result, the redundancy function is implementable with excellent repair efficiency.

In addition, the present invention provides a highly reliable signal line switching circuit that can operate normally even if a fuse has not been cut off completely.

What is claimed is:

1. A semiconductor memory device for accessing a multiplicity of bits at a time responsive to a single address specified, the memory device comprising:

an array of memory cells, which are subdivided into a plurality of memory segments associated with respective addresses, and an internal data bus having the same bit width as the multiplicity of bits for transferring accessed data, the internal data bus including signal lines each corresponding to a bit of the multiplicity of bits, wherein each said memory segment includes:

a memory sub-array, and a sub-data bus having a larger bit width than the multiplicity of bits, the sub-data bus including signal lines each corresponding to a bit within the larger bit width, each of the signal lines being connected to an associated bit line of the memory sub-array, and wherein the array of memory cells includes connection switching means for connecting the signal lines of the internal data bus to associated ones of the signal lines of the sub-data bus to meet a predetermined relationship.

2. The device of claim 1, wherein the connection switching means disconnects a specific signal line of the sub-data bus from a corresponding signal line of the internal data bus, the specific signal line being associated with a defective bit line or a defective memory cell, the connection switching means shifting connections of signal lines succeeding the specific signal line of the sub-data bus such that signal lines other than the defective signal line of the sub-data bus are connected to the signal lines of the internal data bus.

3. The device of claim 2, wherein the connection switching means comprises:

a plurality of first data buses associated with the respective memory segments;

a plurality of data bus switching circuits provided for the respective memory segments, each said data bus switching circuit electrically connecting the signal lines of the sub-data bus associated with the memory segment to signal lines of the first data bus associated with the memory segment to meet the predetermined relationship; and a multiplexer for selecting one of the first data buses that is associated with the memory segment specified and connecting a selected one of the first data buses to the internal data bus.

4. The device of claim 3, wherein the sub-data buses are placed in parallel to the first data buses.

5. The device of claim 3, wherein each said memory segment includes a plurality of the memory sub-arrays, and
wherein the bit lines of the respective memory sub-arrays in each said memory segment are connected in common to the signal lines of the sub-data bus in the memory segment.

6. The device of claim 3, wherein each said data bus switching circuit comprises:
a switch section for electrically connecting each signal line of one of the first data buses to an associated signal line of the sub-data bus in an associated memory segment; and
a switch control section including a plurality of fuses connected in series to each other and controlling the switch section based on terminal potentials of the fuses,
wherein in the switch control section, a first-stage one of the fuses is driven by an associated MOS transistor based on a predetermined potential, while each of the other fuses from the second stage on is driven by an associated MOS transistor based on the terminal potential of a previous-stage one of the fuses.

7. The device of claim 6, wherein at least one inverter comprising an MOS transistor is provided between adjacent ones of the fuses in the switch control section.

8. The device of claim 3, wherein each said data bus switching circuit comprises:
a switch section for electrically connecting each signal line of one of the first data buses to an associated signal line of the sub-data bus in an associated memory segment; and
a switch control section for controlling the switch section,
wherein the switch control section includes:
a plurality of control inverters connected in series to each other, a fuse being inserted into a current path between one power supply and the output terminal of each said control inverter; and
means for applying a predetermined drive potential to the input of a first-stage one of the control inverters so as to turn ON an associated MOS transistor on the current path to which the corresponding fuse is inserted,
wherein each of the remaining control inverters from the second stage on is driven with the output of a previous-stage one of the control inverters so as to turn ON the associated MOS transistor on the current path to which the fuse is inserted when the drive potential is applied to the input of the first-stage control inverter with none of the fuses of the control inverters cut off, and
wherein the switch section is controlled based on the outputs of the respective control inverters.

9. A semiconductor memory device for accessing a multiplicity of bits at a time responsive to a single address specified, the memory device comprising:
an array of memory cells, which are subdivided into a plurality of memory segments associated with respective addresses, and
a plurality of first data buses respectively provided for the memory segments for transferring accessed data, each of the data buses having the same bit width as the multiplicity of bits, each of the first data buses including signal lines each corresponding to a bit of the multiplicity of bits,
wherein each said memory segment includes:
a memory sub-array, and
a data bus switching circuit for connecting signal lines of an associated one of the first data buses to bit lines of the memory sub-array to meet a predetermined relationship,
wherein the data bus switching circuit disconnects a specific bit line from a corresponding signal line of the first data bus, the specific bit line being defective or associated with a defective memory cell, the data bus switching circuit shifting connections of bit lines succeeding the specific bit line such that bit lines other than the specific bit line are connected to the signal lines of the first data bus.

10. The device of claim 9, wherein the bit lines of the memory sub-array associated with each said memory segment are placed in parallel to the first data bus associated with the memory segment.

11. The device of claim 9, wherein each said memory segment includes a plurality of the memory sub-arrays, and wherein the data bus switching circuit is provided for each said memory sub-array.

12. The device of claim 9, wherein each said data bus switching circuit comprises:
a switch section for electrically connecting each of the signal lines of the first data bus to associated one of the bit lines; and
a switch control section including a plurality of fuses connected in series to each other and controlling the switch section based on terminal potentials of the fuses,
wherein in the switch control section, a first-stage one of the fuses is driven by an associated MOS transistor based on a predetermined potential, while each of the other fuses from the second stage on is driven by an associated MOS transistor based on the terminal potential of a previous-stage one of the fuses.

13. The device of claim 12, wherein at least one inverter comprising an MOS transistor is provided between adjacent ones of the fuses in the switch control section.

14. The device of claim 9, wherein each said data bus switching circuit comprises:
a switch section for electrically connecting each of the signal lines of the first data bus to associated one of the bit lines; and
a switch control section for controlling the switch section,
wherein the switch control section includes:
a plurality of control inverters connected in series to each other, a fuse being inserted into a current path between one power supply and the output terminal of each said control inverter; and
means for applying a predetermined drive potential to the input of a first-stage one of the control inverters so as to turn ON an associated MOS transistor on the current path to which the corresponding fuse is inserted,
wherein each of the remaining control inverters from the second stage on is driven with the output of a previous-stage one of the control inverters so as to turn ON the associated MOS transistor on the current path to which the fuse is inserted when the drive potential is applied to the input of the first-stage control inverter with none of the fuses of the control inverters cut off, and
wherein the switch section is controlled based on the outputs of the respective control inverters.

15. A signal line switching circuit comprising:
a switch section for electrically connecting each signal line belonging to a first group of signal lines to an associated signal line belonging to a second group of signal lines to meet a predetermined relationship; and
a switch control section including a plurality of fuses connected in series to each other and controlling the switch section based on terminal potentials of the fuses,
wherein in the switch control section, a first-stage one of the fuses is driven by an associated MOS transistor based on a predetermined potential, while each of the other fuses from the second stage on is driven by an associated MOS transistor based on the terminal potential of a previous-stage one of the fuses.

16. The circuit of claim 15, wherein at least one inverter comprising an MOS transistor is provided between adjacent ones of the fuses in the switch control section.

17. The circuit of claim 15, wherein the f irst group consists of a number n of signal lines and the second group consists of a number (n+1) of signal lines, where n is a positive integer, and
wherein the switch section includes an $i^{th}$ pair of switches, which are provided between the $i^{th}$ one of the signal lines of the first group and the $i^{th}$ and $(i+1)^{st}$ ones of the signal lines of the second group, where i is an integer and $1 \leq i \leq n$, and
wherein the switch control section controls the $i^{th}$ pair of switches based on a terminal potential of the $i^{th}$-stage one of the fuses.

18. The circuit of claim 15, wherein each said signal line of the first and second groups is composed of a number k of signal lines, where k is an integer equal to or larger than two, and
wherein the first group consists of a number n of signal line sets and the second group consists of a number (n+1) of signal line sets, where n is a positive integer, and
wherein the switch section includes an $i^{th}$ group of switches, which are provided between the $i^{th}$ set of the signal lines of the first group and the $i^{th}$ and $(i+1)^{st}$ sets of the signal lines of the second group, where i is an integer and $1 \leq i \leq n$ and the $i^{th}$ group consists of a number 2k of switches, and
wherein the switch control section controls the $i^{th}$ group of switches based on a terminal potential of the $i^{th}$-stage one of the fuses.

19. A signal line switching circuit comprising:
a switching section for electrically connecting each signal line belonging to a first group of signal lines to an associated signal line belonging to a second group of signal lines to meet a predetermined relationship; and
a switch control section for controlling the switch section;
wherein the switch control section includes:
a plurality of control inverters connected in series to each other, a fuse being inserted into a current path between one power supply and the output terminal of each said control inverter; and
means for applying a predetermined drive potential to the input of a first-stage one of the control inverters so as to turn ON an associated MOS transistor on the current path to which the corresponding fuse is inserted,
wherein each of the remaining control inverters from the second stage on is driven with the output of a previous-stage one of the control inverters so as to turn ON the associated MOS transistor on the current path to which the fuse is inserted when the drive potential is applied to the input of the first-stage control inverter with none of the fuses of the control inverters cut off, and
wherein the switch section is controlled based on the outputs of the respective control inverters.

20. The circuit of claim 19, wherein the first group consists of a number n of signal lines and the second group consists of a number (n+1) of signal lines, where n is a positive integer, and
wherein the switch section includes an $i^{th}$ pair of switches, which are provided between the $i^{th}$ one of the signal lines of the first group and the $i^{th}$ and $(i+1)^{st}$ ones of the signal lines of the second group, where i is an integer and $1 \leq i \leq n$, and
wherein the switch control section controls the $i^{th}$ pair of switches based on the output of the $i^{th}$-Stage one of the control inverters.

21. The circuit of claim 19, wherein the potential applying means applies a predetermined initializing potential to the input of the first-stage control inverter so as to turn ON an MOS transistor on a current path between the other power supply, which is more distant from the fuse inserted, and the output terminal of the control inverter, and
wherein the switch control section includes a plurality of latch circuits associated with the respective control inverters, each said latch circuit latching, as the initializing potential thereof, the output of the first-stage control inverter to which the initializing potential is applied as an input.

* * * * *